United States Patent
Chen

(10) Patent No.: US 8,581,560 B2
(45) Date of Patent: Nov. 12, 2013

(54) VOLTAGE REGULATOR CIRCUIT FOR GENERATING A SUPPLY VOLTAGE IN DIFFERENT MODES

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 295 days.

(21) Appl. No.: 12/801,917

(22) Filed: Jul. 1, 2010

(65) Prior Publication Data

US 2012/0001606 A1    Jan. 5, 2012

(51) Int. Cl.
 *G05F 1/56* (2006.01)
 *G05F 1/44* (2006.01)

(52) U.S. Cl.
 USPC ........... 323/266; 323/269; 323/273; 323/274; 323/275; 323/276; 327/538; 327/540; 327/541; 327/545

(58) Field of Classification Search
 USPC ................. 323/268, 269, 273, 274, 275, 276; 327/538, 540, 541, 545
 See application file for complete search history.

(56) References Cited

U.S. PATENT DOCUMENTS

| | | | | |
|---|---|---|---|---|
| 5,892,381 A | * | 4/1999 | Koifman et al. | 327/198 |
| 6,710,583 B2 | * | 3/2004 | Stanescu et al. | 323/280 |
| 6,864,738 B2 | | 3/2005 | Du et al. | |
| 6,985,027 B2 | * | 1/2006 | Yabe | 327/541 |
| 7,279,960 B1 | * | 10/2007 | Lee | 327/538 |
| 7,362,079 B1 | | 4/2008 | Maheedhar et al. | |
| 7,532,535 B2 | | 5/2009 | Jeong | |
| 7,688,667 B2 | * | 3/2010 | Cha et al. | 365/226 |
| 7,714,553 B2 | * | 5/2010 | Lou | 323/276 |

\* cited by examiner

*Primary Examiner* — Bao Q Vu
(74) *Attorney, Agent, or Firm* — Stites & Harbison PLLC; Juan Carlos A. Marquez, Esq.

(57) ABSTRACT

A voltage regulator circuit comprises active and standby amplifiers, first and second transistors, and a capacitor. The active amplifier has a negative input connected to a first reference voltage, and the standby amplifier has a negative input connected to a second reference voltage. The first reference voltage is greater than the second reference voltage. The first transistor has a gate connected to an output of the active amplifier and a drain connected to a voltage regulated output, and the second transistor has a gate connected to an output of the standby amplifier and a drain connected to the voltage regulated output. The capacitor is connected between a chip enable signal and the voltage regulated output.

6 Claims, 2 Drawing Sheets

VOLTAGE REGULATOR CIRCUIT FOR GENERATING A SUPPLY VOLTAGE IN DIFFERENT MODES

BACKGROUND OF THE INVENTION

1. Field of the Invention

The present invention relates to a voltage regulator circuit.

2. Description of the Related Art

A semiconductor memory device such as a dynamic random access memory (DRAM) device operates in either an active mode or standby mode at any given time. For example, in a conventional DRAM device, a read or write operation is normally performed in the active mode and a self-refresh operation is normally performed in the standby mode. In many present-day DRAM applications, the total amount of power consumed by the memory device, as well as the power dissipation while in the standby mode, are desired to be as small as possible. This is especially critical in a battery-operated apparatus or system.

In order to reduce power consumption, the semiconductor memory device operates with a lower supply voltage in the standby mode and a higher supply voltage in the active mode. FIG. 1 shows a power supply circuit for generating supply voltages in active and standby modes disclosed in U.S. Pat. No. 7,532,535. The power supply circuit comprises a first buffer 110, a second buffer 120, a switch 130, and a decoupling capacitor 140. An internal integrated circuit 150 is biased with either the active supply voltage VINTH or the standby supply voltage VINTL. When the semiconductor memory device operates in the standby mode, the standby mode signal PSTBY is activated and the switch 130 is turned off. Thus, the internal integrated circuit 150 is biased with the standby supply voltage VINTL. When the semiconductor memory device switches to operate in the active mode from the standby mode, the standby mode signal PSTBY is deactivated such that the switch 130 is turned on. Therefore, the internal integrated circuit 150 is biased with the active supply voltage VINTH. In the configuration of FIG. 1, since the decoupling capacitor 140 charged to the active power voltage VINTH is used for faster transition time once the switch 130 is turned on, the volume of the capacitor 140 is high and thus a large chip area is required.

For the reasons stated above, there is a need for a memory device to provide a voltage regulator circuit for generating supply voltages in active and standby modes. Such a circuit provides a lower standby supply voltage for reducing power consumption in the standby mode and increasing the response time when the memory device switches to operate in the active mode from the standby mode.

SUMMARY OF THE INVENTION

An aspect of the present invention is to provide a voltage regulator circuit for generating a lower standby supply voltage in a standby mode and generating a higher active supply voltage in an active mode.

According to one embodiment of the present invention, the voltage regulator circuit comprises active and standby amplifiers, first and second transistors, and a capacitor. The active amplifier has a negative input connected to a first reference voltage, and the standby amplifier has a negative input connected to a second reference voltage. The first reference voltage is greater than the second reference voltage. The first transistor has a gate connected to an output of the active amplifier and a drain connected to a voltage regulated output, and the second transistor has a gate connected to an output of the standby amplifier and a drain connected to the voltage regulated output. The capacitor is connected between a chip enable signal and the voltage regulated output.

BRIEF DESCRIPTION OF THE DRAWINGS

The invention will be described according to the appended drawings in which.

DETAILED DESCRIPTION OF THE INVENTION

Figure 2:
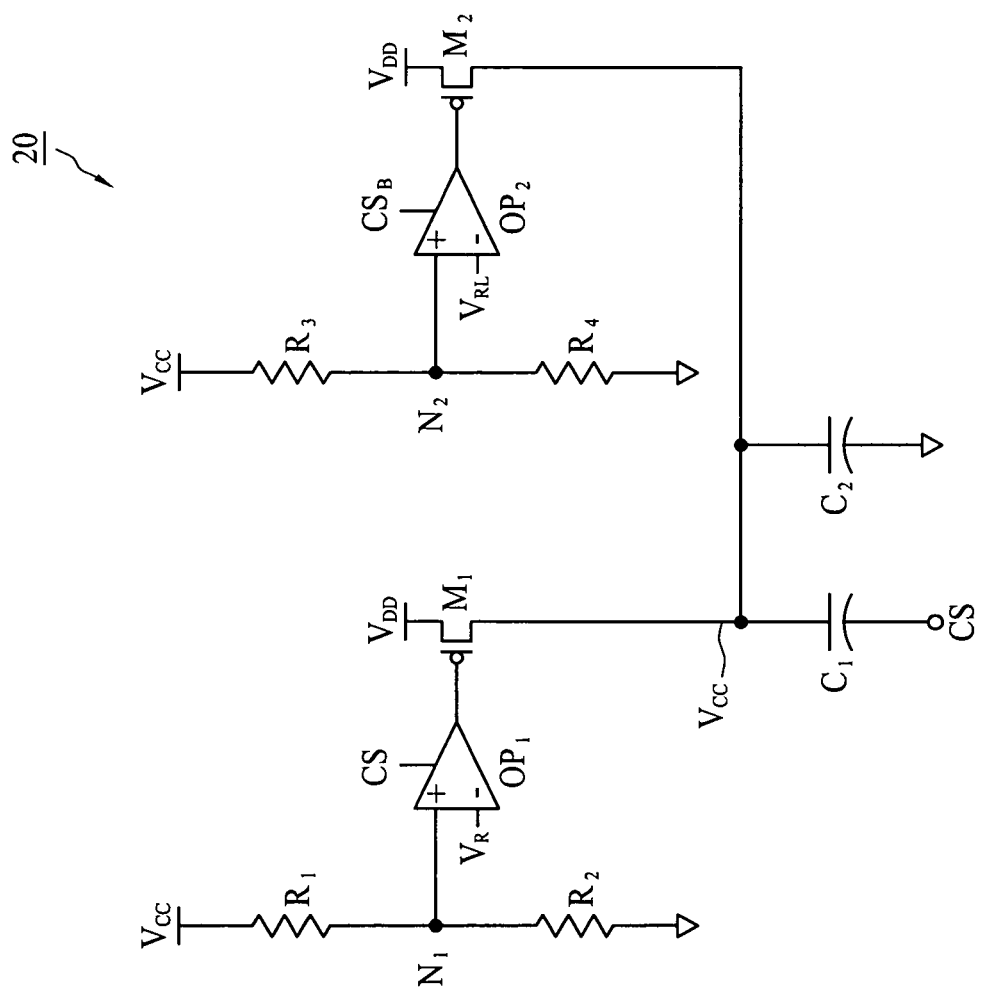
FIG. 2 is a schematic diagram of a voltage regulator circuit in accordance with one embodiment of the invention.

FIG. 2 is a schematic diagram of a voltage regulator circuit 20 in accordance with one embodiment of the invention. Referring to FIG. 2, the voltage regulator circuit 20 comprises an active amplifier $OP_1$ and a standby amplifier $OP_2$ having outputs connected to a gate of a PMOS transistor $M_1$ and a gate of a PMOS transistor $M_2$, respectively. Both drains of the PMOS transistors $M_1$ and $M_2$ are connected to a node $V_{CC}$ for providing supply voltages on internal integrated circuits within a semiconductor memory device. A capacitor $C_2$ is connected between the node $V_{CC}$ and a ground for smoothing the voltage at node $V_{CC}$ during transition. The regulator circuit 20 provides a lower standby supply voltage in the standby mode and provides a higher active supply voltage with fast transition when the internal integrated circuits within the semiconductor memory device enter an active mode.

As shown in FIG. 2, the active amplifier $OP_1$ has a negative input connected to a reference voltage $V_R$, while the standby amplifier $OP_2$ has a negative input connected to a reference voltage $V_{RL}$. In this embodiment, the reference voltage $V_R$ is greater than the reference voltage $V_{RL}$. Resistors $R_1$ and $R_2$ are connected in series between the node $V_{CC}$ and the ground, and a node $N_1$ between the resistors $R_1$ and $R_2$ is connected to a positive input of the active amplifier $OP_1$. Since the active amplifier $OP_1$, the PMOS transistor $M_1$, and the resistors $R_1$ and $R_2$ form a closed loop feedback path as a whole, the voltage at node $V_{CC}$ is proportional to the reference voltage $V_R$ when the active amplifier $OP_1$ is enabled. In this embodiment, the resistances of the resistors $R_1$ and $R_2$ are the same, and thus the voltage at the node $V_{CC}$ is twice the reference voltage $V_R$. However, the present invention is not limited to this embodiment. For example, the resistances of the resistors $R_1$ and $R_2$ are of unequal values, and thus the voltage at node $V_{CC}$ is generated according to the reference voltage $V_R$ and the ratio of the resistance of the resistor $R_1$ to that of the resistor $R_2$.

Referring to FIG. 2, the standby amplifier $OP_2$ has a negative input coupled to the reference voltage $V_{RL}$, wherein the reference voltage $V_{RL}$ is less than the reference voltage $V_R$. Resistors $R_3$ and $R_4$ are connected in series between the node $V_{CC}$ and the ground, and a node $N_2$ between the resistors $R_3$ and $R_4$ is connected to a positive input of the standby amplifier $OP_2$. Since the active amplifier $OP_2$, the PMOS transistor $M_2$, and the resistors $R_3$ and $R_4$ form a closed loop feedback path as a whole, the voltage at the node $V_{CC}$ is proportional to the reference voltage $V_{RL}$ when the standby amplifier $OP_2$ is enabled and the active amplifier $OP_1$ is disabled. In this embodiment, the resistances of the resistors $R_3$ and $R_4$ are the same, and thus the voltage at the node $V_{CC}$ is twice the reference voltage $V_{RL}$. However, the present invention is not limited to this embodiment. For example, the resistances of the resistors $R_3$ and $R_4$ are of unequal values, and thus the voltage at node $V_{CC}$ is generated according to the reference voltage $V_{RL}$ and the ratio of the resistance of the resistor $R_3$ to that of the resistor $R_4$. As shown in FIG. 2, a capacitor $C_1$ is connected between a chip enable signal CS and the node $V_{CC}$. The chip enable signal CS is at a logic high level when the internal integrated circuits within a semiconductor memory device are in the active mode, and the chip enable signal CS is at a logic low level when the integrated circuits are in the standby mode. Therefore, the active amplifier $OP_1$ controlled by the signal CS is enabled in the active mode and disabled in the standby mode for reducing power consumption.

For operation in the standby mode, the standby amplifier $OP_2$ controlled by the signal $CS_B$ is enabled. The signals CS and $CS_B$ are complementary signals. The standby amplifier $OP_2$ draws very little current compared to the active amplifier $OP_1$. Since the active amplifier $OP_1$ is disabled in this mode, the standby amplifier $OP_2$, in combination with the resistors $R_3$ and $R_4$, determines the voltage at node $V_{CC}$. Because the negative input of the standby amplifier $OP_2$ is connected to a lower reference voltage, the voltage at node $V_{CC}$ is lower (1.6V for example), thereby reducing the power consumption of the semiconductor memory device due to the low supply voltage generated in the standby mode.

Figure 1:
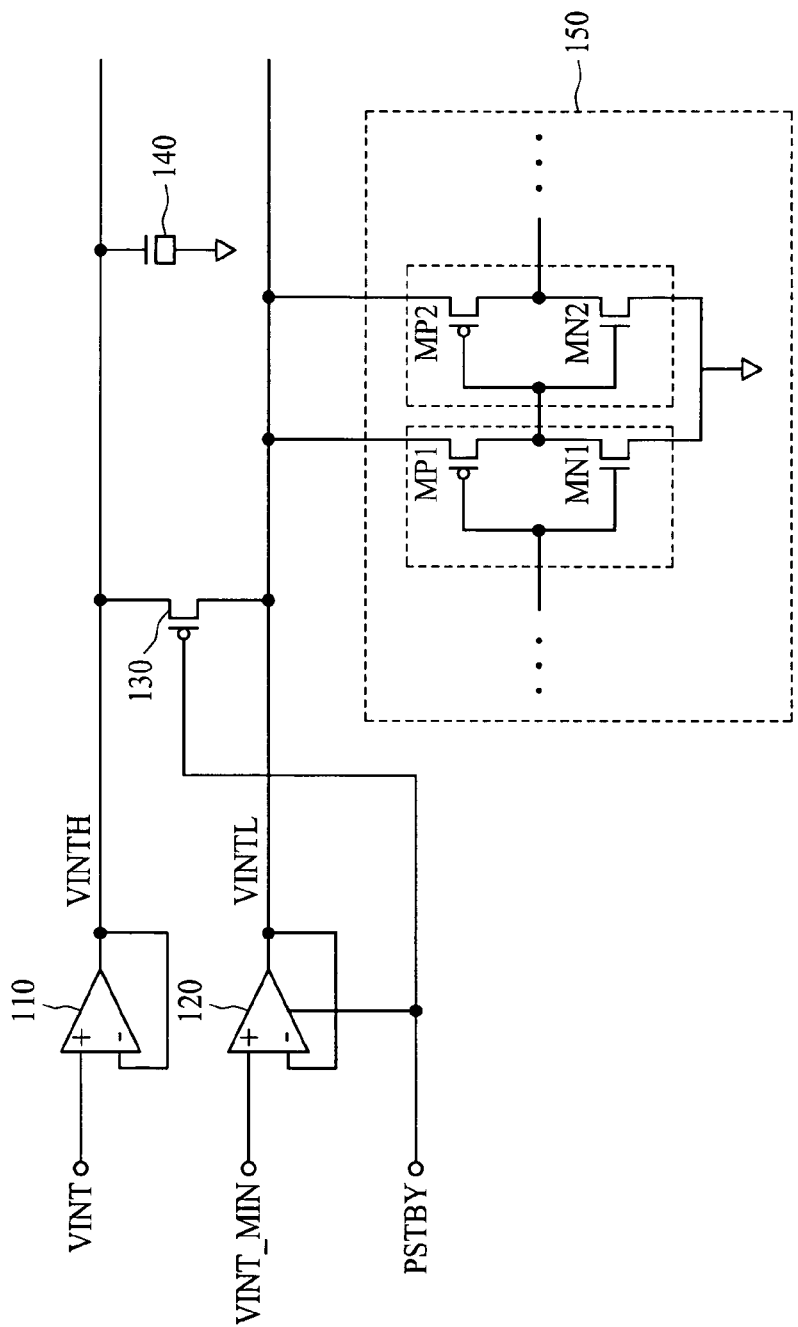
FIG. 1 shows a power supply circuit for generating supply voltages in active operation and standby modes disclosed in U.S. Pat. No. 7,532,535.

When the semiconductor memory device switches to operate in the active mode from the standby mode, the chip enable signal CS switches from a logic low level to a logic high level, thereby enabling the active amplifier $OP_1$. In this condition, the active amplifier $OP_1$, in combination with the resistors $R_1$ and $R_2$, determines the voltage at node $V_{CC}$. Because the negative input of the active amplifier $OP_1$ is connected to a higher reference voltage, the voltage at node $V_{CC}$ is higher (1.8V for example) in a stable state. In addition, the capacitor $C_1$ helps to boost the voltage at node $V_{CC}$ immediately when the chip enable signal CS switches to a logic high level, and thus the response time is improved compared to previous voltage regulator circuits. In the prior art voltage regulator as shown in FIG. 1, since the decoupling capacitor 140 is coupled to the active power voltage VINTH, i.e., 2V, the volume of the capacitor 140 should be high, i.e., 1 nF, so as to regulate the active power voltage VINTH. However, the capacitor $C_1$ is used to boost the voltage at node $V_{CC}$, wherein the voltage drop across the capacitor $C_1$ is equal to an active supply voltage, i.e., 1.8V, minus a standby voltage, i.e., 1.6V. Therefore, a chip area of the capacitor $C_1$ is smaller compared to that of the capacitor 140.

The above-described embodiments of the present invention are intended to be illustrative only. Numerous alternative embodiments may be devised by those skilled in the art without departing from the scope of the following claims.

What is claimed is:

1. A voltage regulator circuit, comprising:
   an active amplifier having a negative input connected to a first reference voltage;
   a standby amplifier having a negative input connected to a second reference voltage;
   a first transistor having a gate connected to an output of the active amplifier and a drain connected to a voltage regulated output;
   a second transistor having a gate connected to an output of the standby amplifier and a drain connected to the voltage regulated output;
   a first capacitor connected between a chip enable signal and the voltage regulated output; and
   a second capacitor connected between the voltage regulated output and the ground,
   wherein the first reference voltage is configured to be higher than the second reference voltage so as to generate a low supply voltage in a standby mode and thereby reduce the power consumption of a semiconductor memory device.

2. The voltage regulator circuit of claim 1, wherein the active amplifier is enabled in an active mode and disabled in a standby mode.

3. The voltage regulator circuit of claim 1, further comprising first and second resistors connected in series between the voltage regulated output and the ground, wherein a node between the first and second resistors is connected to a positive input of the active amplifier.

4. The voltage regulator circuit of claim 1, further comprising third and fourth resistors connected in series between the voltage regulated output and the ground, wherein a node between the third and fourth resistors is connected to a positive input of the standby amplifier.

5. The voltage regulator circuit of claim 1, wherein the standby amplifier draws significantly smaller current than the active amplifier.

6. The voltage regulator circuit of claim 1, wherein the chip enable signal is switched from a logic low level to a logic high level when the voltage regulator switches to operate in the active mode.

* * * * *